US010914784B2

(12) United States Patent
Chan et al.

(10) Patent No.: US 10,914,784 B2
(45) Date of Patent: Feb. 9, 2021

(54) METHOD AND APPARATUS FOR PROVIDING UFS TERMINATED AND UNTERMINATED PULSE WIDTH MODULATION SUPPORT USING DUAL CHANNELS

(71) Applicant: Advantest Corporation, Tokyo (JP)

(72) Inventors: Andrew Chan, San Jose, CA (US); Edmundo De La Puente, San Jose, CA (US); Preet Paul Singh, San Jose, CA (US); Sivanarayana Pandian Rajadurai, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 16/403,326

(22) Filed: May 3, 2019

(65) Prior Publication Data
US 2020/0033405 A1   Jan. 30, 2020

Related U.S. Application Data

(60) Provisional application No. 62/711,383, filed on Jul. 27, 2018.

(51) Int. Cl.
*G01R 31/317* (2006.01)
*G01R 31/3177* (2006.01)
*G01R 31/28* (2006.01)

(52) U.S. Cl.
CPC ..... *G01R 31/3177* (2013.01); *G01R 31/2834* (2013.01); *G01R 31/31721* (2013.01); *G01R 31/31723* (2013.01)

(58) Field of Classification Search
CPC .......... G01R 31/3177; G01R 31/31723; G01R 31/31721; G01R 31/2834; G01R 31/2894; G01R 31/31907
USPC ....................................................... 714/738
See application file for complete search history.

(56) References Cited

U.S. PATENT DOCUMENTS

| 4,412,323 A * | 10/1983 | Abbott ...... H04J 3/14 370/217 |
| 6,634,016 B1 * | 10/2003 | Farooq ...... G01R 31/318519 716/117 |
| 7,100,098 B2 * | 8/2006 | Hildebrant ...... G01R 31/31917 714/718 |

(Continued)

*Primary Examiner* — Albert Decady
*Assistant Examiner* — Enam Ahmed

(57) ABSTRACT

An automated test equipment (ATE) system comprises a system controller, wherein the system controller is communicatively coupled to a tester processor and an FPGA. The FPGA is communicatively coupled to the tester processor, wherein the FPGA is configured to internally generate commands and data transparently from the tester processor for testing a DUT. Further, the system comprises a demultiplexer positioned between the DUT and the FPGA, wherein, responsive to a determination that the DUT is operating in a high speed mode, the demultiplexer is configured to channel data traffic from the DUT to a Serializer/Deserializer (SerDes) receiver on the FPGA, and further wherein, responsive to a determination that the DUT is operating in a low speed mode, the demultiplexer is configured to channel data traffic from the DUT to input buffers on the FPGA with switchable on/off input terminations.

20 Claims, 10 Drawing Sheets

(56) References Cited

U.S. PATENT DOCUMENTS

| | | | |
|---|---|---|---|
| 7,496,820 B1* | 2/2009 | Theron | G01R 31/31813 |
| | | | 703/15 |
| 2010/0313089 A1* | 12/2010 | Rajski | G01R 31/31854 |
| | | | 714/731 |
| 2011/0087942 A1* | 4/2011 | Conner | G01R 31/31908 |
| | | | 714/738 |
| 2015/0135026 A1* | 5/2015 | Lai | G11C 29/56008 |
| | | | 714/718 |
| 2017/0212164 A1* | 7/2017 | Caradonna | G01R 31/2889 |
| 2018/0284871 A1* | 10/2018 | Surti | G06F 1/3243 |

* cited by examiner

Figure 8 State Diagram for Type-I M-RX

| Differential LINE Voltage | M-TX Output Impedance | M-RX Input Impedance | LINE State Set by | LINE State Name |
|---|---|---|---|---|
| Positive | Low | Any | M-TX | DIF-P |
| Negative | Low | Any | M-TX | DIF-N |
| Zero | High | Medium | M-RX | DIF-Z |
| Unknown or floating | High | High | None | DIF-Q |

Figure 7B

METHOD AND APPARATUS FOR PROVIDING UFS TERMINATED AND UNTERMINATED PULSE WIDTH MODULATION SUPPORT USING DUAL CHANNELS

CROSS-REFERENCE TO RELATED APPLICATIONS

This application is a conversion of and claims priority to and the benefit of Provisional Patent Application No. 62/711,383, entitled "UFS TERMINATED AND UNTERMINATED PWM SUPPORT USING DUAL CHANNELS INCLUDING HIB8 DETECTION," having a filing Date of Jul. 27, 2018, which is herein incorporated by reference in its entirety.

FIELD OF THE INVENTION

The present disclosure relates generally to the field of electronic device testing systems and more specifically to the field of electronic device testing equipment for testing devices under test (DUTs).

BACKGROUND OF THE INVENTION

Automated test equipment (ATE) can be any testing assembly that performs a test on a semiconductor device or electronic assembly. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing. ATE systems both reduce the amount of time spent on testing devices to ensure that the device functions as designed and serve as a diagnostic tool to determine the presence of faulty components within a given device before it reaches the consumer.

FIG. 1 is a schematic block diagram of a conventional automatic test equipment body 100 for testing certain typical DUTs e.g. a semiconductor memory device such as a DRAM. The ATE includes an ATE body 100 with hardware bus adapter sockets 110A-110N. Hardware bus adapter cards 110A-110N specific to a particular communication protocol e.g. PCIe, USB, SATA, SAS etc. connect to the hardware bus adapter sockets provided on the ATE body and interface with the DUTs via cables specific to the respective protocol. The ATE body 100 also includes a tester processor 101 with an associated memory 108 to control the hardware components built into the ATE body 100 and to generate the commands and data necessary to communicate with the DUTs being tested through the hardware bus adapter cards. The tester processor 101 communicates with the hardware bus adapter cards over system bus 130. The tester processor may be programmed to include certain functional blocks including a pattern generator 102 and a comparator 106. Alternatively, the pattern generator 102 and comparator 106 may be hardware components mounted on an expansion or adapter card that plug into the ATE body 100.

The ATE body 100 tests the electrical functions of the DUTs 112A-112N connected to the ATE body 100 through hardware bus adapters plugged into the hardware bus adapter sockets of the ATE body 100. Accordingly, the tester processor 101 is programmed to communicate the test programs needed to be run to the DUTs using the protocol unique to the hardware bus adapters. Meanwhile, the other hardware components built into the ATE body 100 communicate signals with each other and with the DUTs according to test programs operating in the tester processor 101.

The test program run by the tester processor 101 may include a function test which involves writing input signals created by the pattern generator 102 to the DUTs, reading out the written signals from the DUTs and using the comparator 106 to compare the output with the expected patterns. If the output does not match the input, the tester processor 101 will identify the DUT as being defective. For example, if the DUT is a memory device such as a DRAM, the test program will write data generated by the pattern generator 102 to the DUT using a Write Operation, read data from the DRAM using a Read Operation and compare the expected bit pattern with the read pattern using the comparator 106.

In conventional systems, the tester processor 101 needs to contain the functional logic blocks to generate the commands and test patterns used in testing the DUTs, such as the pattern generator 102 and the comparator 106, programmed in software directly on the processor. However, in some instances certain functional blocks such as the comparator 106 may be implemented on a field programmable gate array (FPGA), which is an application specific integrated circuit (ASIC) type semiconductor device that can program logic circuits according to a user's demand.

The FPGAs used in conventional systems rely on the tester processor 101 to transfer the commands and test patterns to the FPGA, which the FPGA in turn relays over to the DUTs. Because the tester processor, and not the FPGA, is responsible for generating the commands and test patterns, the number and type of DUTs that can be tested with a given ATE body is limited by the processing capabilities and programming of the tester processor. Where the tester processor generates all the commands and test patterns, bandwidth constraints on the system bus 130 connecting the tester processor to the various hardware components, including any FPGA devices and hardware bus adapter sockets, also places an upper limit on the number of DUTs that can tested simultaneously.

Also, in conventional systems, the communication protocol used to communicate with the DUTs is fixed because the hardware bus adapter cards that plug into the ATE body 100 are single purpose devices that are designed to communicate in only one protocol and cannot be reprogrammed to communicate in a different protocol. For example, an ATE body configured to test PCIe devices will have hardware bus adapter cards plugged into the body that support only the PCIe protocol. In order to test DUTs supporting a different protocol, e.g., Universal Flash Storage (UFS) the user would ordinarily need to replace the PCIe hardware bus adapter cards with bus adapter cards supporting the UFS protocol. Unless the PCIe hardware bus adapter cards are physically substituted with cards supporting the other protocol, such a system can only test DUTs that support the PCIe protocol. Thus, on the test floor, critical time is consumed replacing hardware bus adapter cards when DUTs running a different protocol from the one that the existing adapter cards support need to be tested.

Another drawback of current tester systems is that most off-the-shelf FPGA systems are not configured to provide native support for UFS protocols. The UFS protocol is a high-speed communication protocol between a Host Controller and a memory device. The key benefit of the UFS protocol is that it consumes less power than other protocols, e.g., PCIe. To reduce power usage, the UFS protocol supports low speed gears and also certain power saving states. However, supporting the low speed gears and power saving states in the UFS specification requires special accommodations in the hardware. UFS is not currently as widely adopted as PCIe and, therefore, off-the-shelf FPGAs do not natively support all the various modes (including the low speed gears and certain power saving states) specified in the UFS specification. Accordingly, conventional ATE systems that use FPGAs to communicate with DUTs are not able to adequately test DUTs that are UFS-compliant.

BRIEF SUMMARY OF THE INVENTION

Accordingly, a need exists for a tester architecture that can address the problems with the systems described above. What is needed is a test architecture whereby the command and test pattern generation functionality can be transferred onto the FPGA, so that the processing load on the tester processor and the bandwidth requirements on the system bus can be kept at a minimum. This would be more efficient than prior configurations where the tester processor bore the entire processing load and the system bus conveyed test data and commands for all the DUTs connected to the ATE body. Further, what is needed is a test architecture whereby the communicative protocol engine can be programmed on FPGA devices so that the protocol used to communicate with the DUTs is reconfigurable.

In addition, what is needed is a tester system wherein the FPGA devices are configured to support UFS-compliant DUTs. In other words, the FPGA devices in the ATE systems need to be configured in a way such that they provide support for certain modes (e.g., low speed gears and certain power saving states) specified in the UFS specification—by comparison, off-the-shelf FPGAs would not contain such support.

Embodiments of the present invention use Serializer/Deserializer (SerDes) channels in off-the-shelf FPGAs to communicate with UFS-compliant DUTs. Off-the-shelf FPGAs, however, typically cannot disable the input terminations (typically 100-ohms differential) of the SerDes channels to allow for Unterminated Receive (to comply with UFS Unterminated Receive mode as specified in the UFS specification). Embodiments of the present invention, therefore, create an alternate path to a different set of FPGA input pins (unassociated with the SerDes channels) that have control over their input terminations. In other words, the on/off states of the input terminations of the different set of FPGA input pins can be easily controlled. This allows the FPGA to comply with the Unterminated Receive mode specified in the UFS M-PHY specification.

Further, embodiments of the present invention are able to configure the FPGAs to detect when a UFS-compliant DUT exits a power saving state, e.g., the UFS HIBERN8 state. Embodiments of the present invention are able to configure the FPGAs to detect the UFS HIBERN8-exit condition without adding board-level circuitry to implement a UFS M-PHY squelch-detector.

In one embodiment, an automated test equipment (ATE) system comprises a system controller, wherein the system controller is communicatively coupled to a tester processor and an FPGA. The FPGA is communicatively coupled to the tester processor, wherein the FPGA is configured to internally generate commands and data transparently from the tester processor for testing a DUT. Further, the system comprises a demultiplexer positioned between the DUT and the FPGA, wherein, responsive to a determination that the DUT is operating in a high speed mode, the demultiplexer is configured to channel data traffic from the DUT to a Serializer/Deserializer (SerDes) receiver on the FPGA, and further wherein, responsive to a determination that the DUT is operating in a low speed mode, the demultiplexer is configured to channel data traffic from the DUT to input buffers on the FPGA with switchable on/off input terminations.

In another embodiment, a tester system is disclosed. The tester system comprises a system controller, wherein the system controller is communicatively coupled to a plurality of tester slice, wherein each tester slice comprises a tester processor and an FPGA. The FPGA is communicatively coupled to the tester processor, wherein the FPGA is configured to internally generate commands and data transparently from the tester processor for testing a plurality of DUTs, wherein the plurality of DUTs are communicatively coupled to the FPGA, and wherein the plurality of DUTs are configured to communicate using at least the UFS protocol. The system also comprises a demultiplexer positioned between each of the plurality of DUTs and the FPGA, wherein, responsive to a determination that a respective DUT is operating in a high speed mode, the demultiplexer is configured to channel data traffic from the DUT to a Serializer/Deserializer (SerDes) receiver on the FPGA, and further wherein, responsive to a determination that the respective DUT is operating in a low speed mode, the demultiplexer is configured to channel data traffic from the DUT to input buffers on the FPGA with switchable input terminations.

In a different embodiment, a method for testing using an automated test equipment (ATE) is disclosed. The method comprises transmitting data from a DUT to an FGA device in a tester system, wherein the DUT is configured to communicate with the FPGA device using the UFS protocol, and wherein the DUT is configured to communicate with the FPGA using a plurality of modes supported by the UFS protocol, wherein the plurality of modes comprise at least a high speed mode and a low speed mode. Further, the method comprises selecting, using a demultiplexer, a receive channel to route the data to the FPGA, wherein the selected receive channel depends on a mode of operation of the DUT. Responsive to a determination that the DUT is operating in the high speed mode, the demultiplexer selects a SerDes channel to route the data to the FPGA, and responsive to a determination that the DUT is operating in the low speed mode, the demultiplexer selects a channel comprising switchable input terminations to route the data to the FPGA.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

FIG. 7B illustrates the various differential voltage line states as defined by the UFS M-PHY specification.

Figure 1:
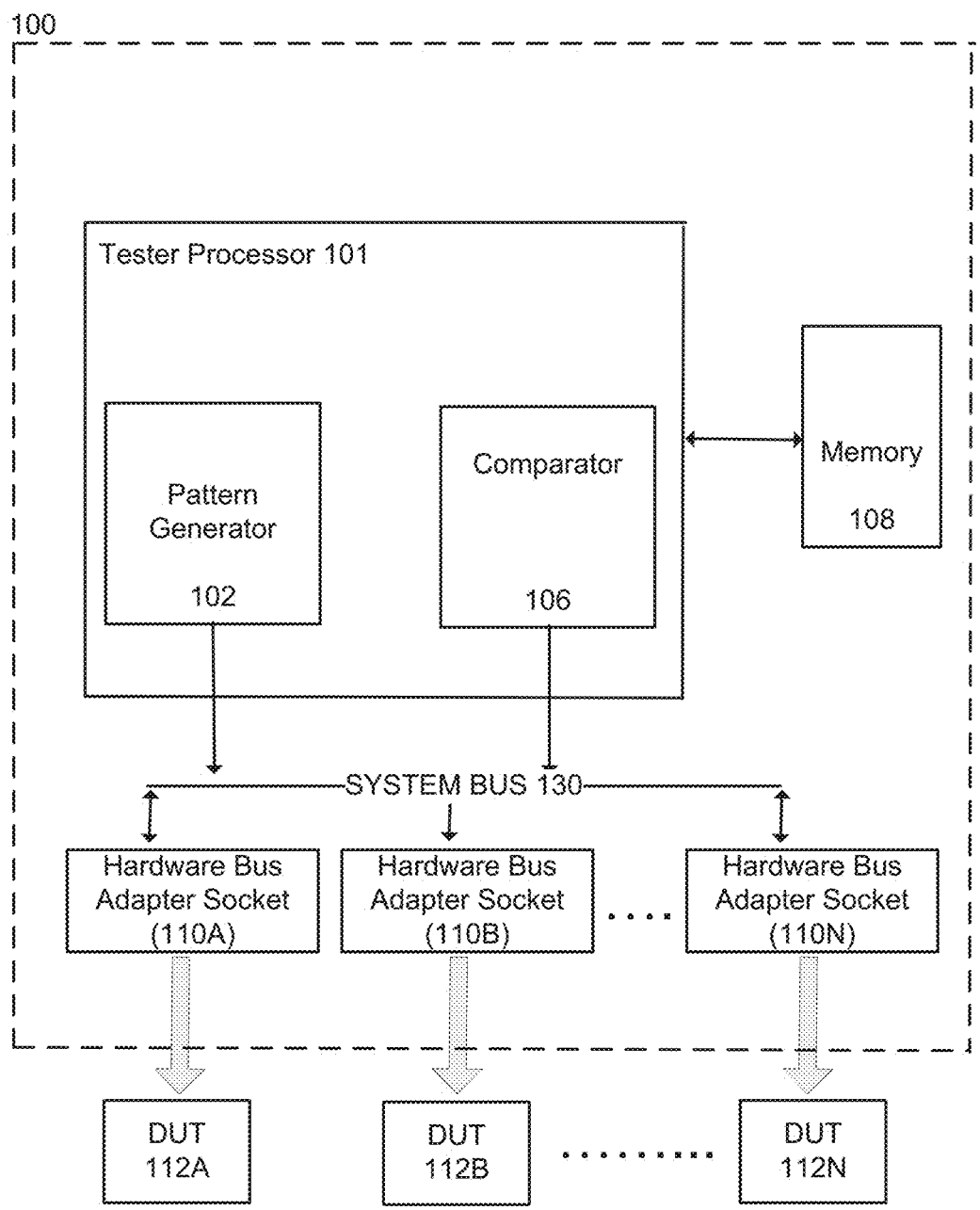
FIG. 1 is a schematic block diagram of a conventional automatic test equipment body for testing a typical device under test (DUT).

In the figures, elements having the same designation have the same or similar function.

DETAILED DESCRIPTION OF THE INVENTION

Reference will now be made in detail to embodiments, examples of which are illustrated in the accompanying drawings. While the embodiments will be described in conjunction with the drawings, it will be understood that they are not intended to limit the embodiments. On the contrary, the embodiments are intended to cover alternatives, modifications and equivalents. Furthermore, in the following detailed description, numerous specific details are set forth in order to provide a thorough understanding. However, it will be recognized by one of ordinary skill in the art that the embodiments may be practiced without these specific details. In other instances, well-known methods, procedures, components, and circuits have not been described in detail as not to unnecessarily obscure aspects of the embodiments.

Notation and Nomenclature Section

Some regions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing the terms such as "coupling," "communicating," "selecting," "driving," "transmitting," "receiving," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The description below provides a discussion of computers and other devices that may include one or more modules. As used herein, the term "module" or "block" may be understood to refer to software, firmware, hardware, and/or various combinations thereof. It is noted that the blocks and modules are exemplary. The blocks or modules may be combined, integrated, separated, and/or duplicated to support various applications. Also, a function described herein as being performed at a particular module or block may be performed at one or more other modules or blocks and/or by one or more other devices instead of or in addition to the function performed at the described particular module or block. Further, the modules or blocks may be implemented across multiple devices and/or other components local or remote to one another. Additionally, the modules or blocks may be moved from one device and added to another device, and/or may be included in both devices. Any software implementations of the present invention may be tangibly embodied in one or more storage media, such as, for example, a memory device, a floppy disk, a compact disk (CD), a digital versatile disk (DVD), or other devices that may store computer code.

The terminology used herein is for the purpose of describing particular embodiments only and is not intended to limit the scope of the present invention. As used throughout this disclosure, the singular forms "a," "an," and "the" include plural reference unless the context clearly dictates otherwise. Thus, for example, a reference to "a module" includes a plurality of such modules, as well as a single module, and equivalents thereof known to those skilled in the art.

Method and Apparatus For Providing UFS Terminated and Unterminated Pulse Width Modulation Support Using Dual Channels Embodiments of the present invention provide a tester system wherein the FPGA devices are configured to connect with and test multiple UFS-compliant DUTs concurrently. In other words, the FPGA devices in the ATE systems are configured in a way such that they provide support for certain modes (e.g., low speed gears and certain power saving states) specified in the UFS specification.

Embodiments of the present invention use Serializer/Deserializer (SerDes) channels in off-the-shelf FPGAs to communicate with UFS-compliant DUTs. Off-the-shelf FPGAs, however, typically cannot disable the input terminations (typically 100-ohms differential) of the SerDes channels to allow for Unterminated Receive (to comply with UFS Unterminated Receive mode as specified in the UFS specification). Embodiments of the present invention, therefore, create an alternate path to a different set of FPGA input pins (unassociated with the SerDes channels) that have control over their input terminations. In other words, the on/off states of the input terminations of the different set of FPGA input pins can be easily controlled. This allows the FPGA to comply with the Unterminated Receive mode specified in the UFS M-PHY specification.

Further, embodiments of the present invention are able to configure the FPGAs to detect when a UFS-compliant DUT exits a power saving state, e.g., the UFS HIBERN8 state. Embodiments of the present invention are able to configure the FPGAs to detect the UFS HIBERN8-exit condition without adding board-level circuitry to implement a UFS M-PHY squelch-detector.

Figure 2:
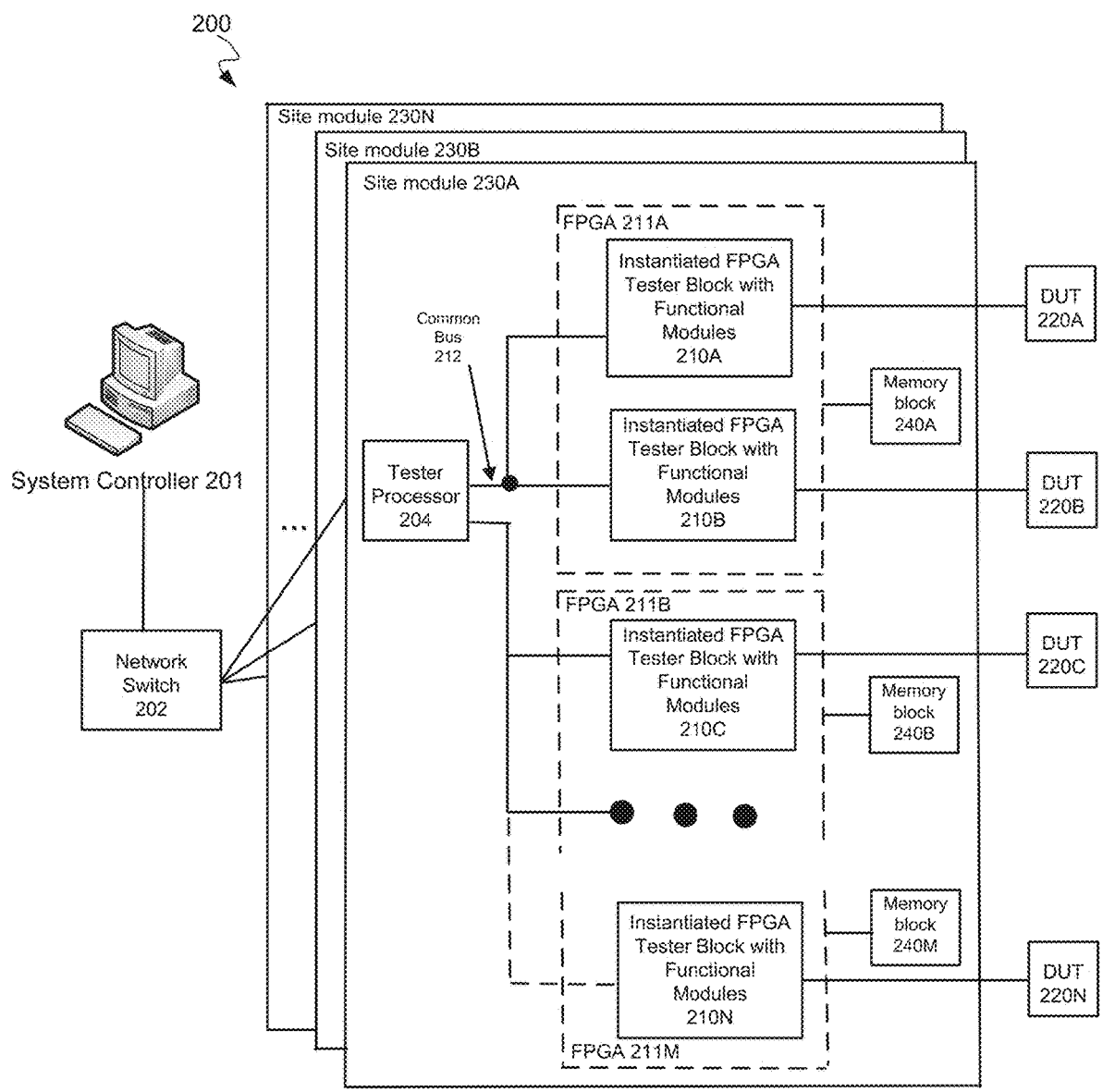
FIG. 2 is a high level schematic block diagram of the interconnections between the system controller, the site modules and the DUTs according to one embodiment of the present invention.

FIG. 2 is an exemplary high level block diagram of the automatic test equipment (ATE) apparatus 200 in which a tester processor is connected to the devices under test (DUTs) through FPGA devices with built-in functional modules in accordance with an embodiment of the present invention. In one embodiment, ATE apparatus 200 may be implemented within any testing system capable of testing multiple DUTs simultaneously.

Referring to FIG. 2, an ATE apparatus 200 for testing semiconductor devices more efficiently in accordance with an embodiment of the present invention includes a system controller 201, a network switch 202 connecting the system controller to the site module boards 230A-230N, FPGA devices 211A-211M comprising instantiated FPGA tester blocks 210A-210N, memory block modules 240A-240M wherein each of the memory blocks is connected to one of the FPGA devices 211A-211M, and the devices under test (DUTs) 220A-220N, wherein each device under test 220A-220N is connected to one of the instantiated FPGA tester blocks 210A-210N. It should be noted that the DUTs 220A-220N can, in one embodiment, be solid state drives (SSDs). Furthermore, it is possible for a single instantiated FPGA tester block, as shown in FIG. 2, to also be connected to multiple DUTs. The DUTs may communicate to the FPGA blocks using one or more of several different protocols, including PCIe and UFS.

In one embodiment, the system controller 201 may be a computer system, e.g., a personal computer (PC) that provides a user interface for the user of the ATE to load the test programs and run tests for the DUTs connected to the ATE 200. In one embodiment, the system controller 201 may be running the Linux operation system (OS). The Advantest FutureSuite software executing in the Linux environment is one example of test software normally used during device testing. It provides the user with a graphical user interface from which to configure and control the tests. It can also comprise functionality to control the test flow, control the status of the test program, determine which test program is running, and log test results and other data related to test flow. In one embodiment, the system controller can be connected to and control as many as 768 DUTs.

In one embodiment, the system controller 201 can be connected to the site module boards 230A-230N through a network switch, such as an Ethernet switch. In other embodiments, the network switch may be compatible with a different protocol such as TCP/IP, Fibre Channel, 802.11 or ATM, for instance.

In one embodiment, each of the site module boards 230A-230N may be a separate standalone board that attaches to custom-built load board fixtures, on which the DUTs 220A-220N are loaded, and also to the system controller 201 from where the test programs are received. In other embodiments, the site module boards may be implemented as plug-in expansion cards or as daughter boards that plug into the chassis of the system controller 201 directly. Alternatively, the site module boards may be housed within a stand-alone enclosure and may connect to the various DUTs using a device interface board (DIB).

The site module boards 230A-230N can each comprise at least one tester processor 204 and at least one FPGA device. In one embodiment, the tester processor and its associated memory may be located on a separate board (not shown) affixed to the respective site module. This separate board may be called a Computer On Module (or COM) board. In other words, the FPGA may be located on a site module board while the tester processor (with an associated memory) is located on a COM board.

The tester processor 204 and the FPGA devices 211A-211M on the site module board run the test methods for each test case in accordance with the test program instructions received from the system controller 201. In one embodiment the tester processor can be a commercially available Intel x86 CPU or any other well-known processor. Further, the tester processor may be operating on the Ubuntu OS x64 operating system and running the Core Software, which allows it to communicate with the software running on the system controller, to run the test methods. In one embodiment, the tester processor 204 may be an x86 processor running the Linux OS or a modified version of the Linux OS. In one embodiment, the Linux OS running on the tester processor is able to receive commands and data from the Windows OS running on the system controller. The tester processor 204 controls the FPGA devices on the site module and the DUTs connected to the site module based on the test program received from the system controller.

The tester processor 204 is connected to and can communicate with the FPGA devices over bus 212. In one embodiment, tester processor 204 communicates with each of the FPGA devices 211A-211M over a separate dedicated bus. In one embodiment, for example in the standard or bypass mode, tester processor 204 can control the testing of the DUTs 220A-220N transparently through the FPGAs with minimal processing functionality allocated to the FPGA devices. In this embodiment, the data traffic capacity of bus 212 can be exhausted rapidly because all the commands and data generated by the tester processor need to be communicated over the bus to the FPGA devices. In other embodiments, the tester processor 204 can share the processing load by allocating functionality to control the testing of the DUTs to the FPGA devices, e.g., in protocol independent data accelerations (PIDA) or full acceleration (FA) modes as will be discussed further below. In these embodiments, the traffic over bus 212 is reduced because the FPGA devices can generate their own commands and data.

In one embodiment, each of the FPGA devices 211A-211M is connected to its own dedicated memory block 240A-240M. These memory blocks can, among other things, be utilized to store the test pattern data that is written out to the DUTs. In one embodiment, each of the FPGA devices can comprise two instantiated FPGA tester blocks 210A-210B with functional modules for performing functions including implementation of communicative protocol engines and hardware accelerators as described further herein. Memory blocks 240A-240M can each contain one or more memory modules, wherein each memory module within the memory block can be dedicated to one or more of the instantiated FPGA tester blocks 210A-210B. Accordingly, each of the instantiated FPGA tester blocks 210A-210B can be connected to its own dedicated memory module within memory block 240A. In another embodiment, instantiated FPGA tester blocks 210A and 210B can share one of the memory modules within memory block 240A. In a different embodiment, each FPGA device can have multiple instantiated FPGA tester blocks, each with a respective memory block.

Further, each of the DUTs 220A-220N in the system can be connected to a dedicated instantiated FPGA tester block 210A-210N in a "tester per DUT" configuration, wherein each DUT gets its own tester block. This allows separate test execution for each DUT. The hardware resources in such a configuration are designed in a manner to support individual DUTs with minimal hardware sharing. This configuration also allows many DUTs to be tested in parallel, where each DUT can be connected to its own dedicated FPGA tester block and be running a different test program. In a different embodiment, each instantiated FPGA tester block may also be connected to and configured to test multiple DUTs.

The architecture of the embodiment of the present invention depicted in FIG. 2 has several advantages. First, it eliminates the need for protocol-specific hardware bus adapter sockets and cards in the system because the communication protocol modules can be programmed directly on the instantiated FPGA tester blocks within the FPGA devices. The instantiated tester blocks can be configured to communicate with the DUTs in any protocols that the DUTs support, e.g., PCIe, UFS, SATA etc. Accordingly, if DUTs with different protocol support need to be tested, they can be connected to the same system and the FPGAs can be reprogrammed with support for the associated protocols. As a result, one ATE body can be easily configured to test DUTs supporting many different types of protocols.

In one embodiment, new protocols can be downloaded and installed directly on the FPGAs via a simple bit-stream download from a cache on system controller 201 without any kind of hardware interactions. An FPGA will typically include a configurable interface core (or IP core) that is programmable to provide functionality of one or more protocol based interfaces for a DUT and is programmable to interface with the DUT. For example, the FPGAs 211A-211M in the ATE apparatus 200 will include an interface core that can be configured with the PCIe protocol to test PCIe devices initially and subsequently reconfigured via a software download to test UFS-compliant devices. Also, if a new protocol is released, the FPGAs can easily be configured with that protocol via a bit-stream download instead of having to physically switch all the hardware bus adapter cards in the system. Finally, if a non-standard protocol needs to be implemented, the FPGAs can nonetheless be configured to implement such a protocol.

In another embodiment, the FPGAs 211A-211M can be configured to run more than one communicative protocol, wherein these protocols also can be downloaded from system controller 201 and configured through software. In other words, each FPGA implements custom firmware and software images to implement the functionality of one or more PC based testers in a single chip. The required electrical signaling and protocol-based signaling is provided by on-chip IP cores in the FPGAs. As mentioned above, each FPGA is programmable with pre-verified interface or IP cores. This ensures compliance and compatibility according to a given interface standard. The programmable nature of the FPGA is utilized to optimize flexibility, cost, parallelism and upgradeabilty for storage testing applications from SSDs, HDDs and other protocol based storage devices.

For instance, instantiated FPGA tester block 210A can be configured to run the PCIe protocol while instantiated FPGA tester block 210B can be configured to run the UFS protocol. This allows the tester hardware to test DUTs supporting different protocols simultaneously. FPGA 211A can now be connected to test a DUT that supports both PCIe and UFS protocols. Alternatively, it can be connected to test two different DUTs, one DUT supporting the PCIe protocol and the other DUT supporting the UFS protocol, where each instantiated functional module (e.g., 210A, 210B) is configured with a protocol to test the respective DUT it is connect to.

In one embodiment, the interface or IP core in the FPGA may be acquired from a third party vendor but may require some customization to be compatible with the embodiments described herein. In one embodiment, the interface core provides two functions: a) wraps storage commands into a standard protocol for transmission over a physical channel; and 2) is the electrical signal generator and receiver.

The other major advantage of the architecture presented in FIG. 2 is that it reduces processing load on the tester processor 204 by distributing the command and test pattern generating functionality to FPGA devices, where each DUT has a dedicated FPGA module running the test program specific to it. For instance, instantiated FPGA tester block 210A is connected to DUT 220A and runs test programs specific to DUT 220A. The hardware resources in such a configuration are designed in a manner to support individual DUTs with minimal hardware sharing. This "tester per DUT" configuration also allows more DUTs to be tested per processor and more DUTs to be tested in parallel. Furthermore, with the FPGAs capable of generating their own commands and test patterns in certain modes, the bandwidth requirements on bus 212 connecting the tester processor with the other hardware components, including FPGA devices, device power supplies (DPS) and DUTs, is also reduced. As a result more DUTs can be tested simultaneously than in prior configurations. In other words, without the tester processor 204 acting as a bottleneck, each of the FPGAs can connect to several DUTs and test them concurrently.

Figure 3:
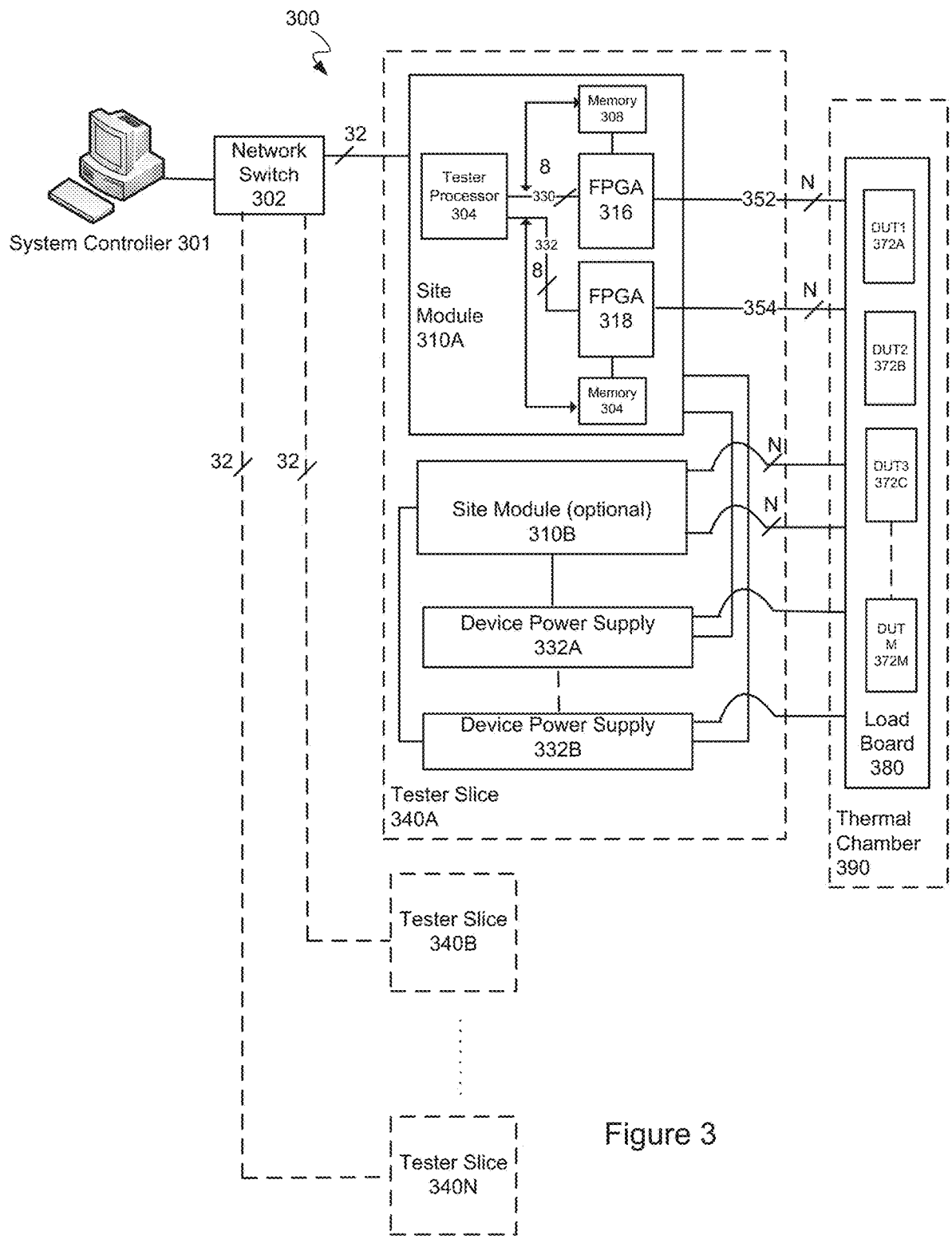
FIG. 3 is a detailed schematic block diagram of the site module and its interconnections with the system controller and the DUTs according to an embodiment of the present invention.

FIG. 3 provides a more detailed schematic block diagram of the site module and its interconnections with the system controller and the DUTs in accordance with an embodiment of the present invention.

Referring to FIG. 3, the site modules of the ATE apparatus, in one embodiment, can be mechanically configured onto tester slices 340A-340N, wherein each tester slice comprises at least one site module. In certain typical embodiments, each tester slice can comprise two site modules and two device power supply boards. In other embodiments, the tester slice may comprise more or fewer site modules and/or power supply boards. Tester slice 340A of FIG. 3, for example, comprises site modules 310A and 310B and device power supply boards 332A and 332B. However, there is no limit to the number of device power supply boards or site modules that can be configured onto a tester slice. Tester slice 340 is connected to system controller 301 through network switch 302. System controller 301 and network switch 302 perform the same function as elements 201 and 202 in FIG. 2 respectively. Network switch 302 can be connected to each of the site modules with a 32 bit wide bus.

As mentioned above, in one embodiment, the system controller 301 may be a computer system, e.g., a personal computer (PC) that provides a user interface for the user of the ATE to load the test programs and run tests for the DUTs connected to the ATE 300. Typically the system controller will run the Linux operating system. The Advantest FutureSuite is one example of test software normally used during device testing.

Each of the device power supply boards 332A-332B can be controlled from one of the site modules 310A-310B. The software running on the tester processor 304 can be configured to assign a device power supply to a particular site module. In one embodiment, the site modules 310A-310B and the device power supplies 332A-332B are configured to communicate with each other using a high speed serial protocol, e.g., Peripheral Component Interconnect Express (PCIe).

In one embodiment, each site module is configured with two FPGAs as shown in FIG. 3. Each of the FPGAs 316 and 318 in the embodiment of FIG. 3. is controlled by the tester processor 304 and performs a similar function to FPGAs 211A-211M in FIG. 2. The tester processor 304 can communicate with each of the FPGAs using a 8 lane high speed serial protocol interface such as PCIe as indicated by system buses 330 and 332 in FIG. 3. In other embodiments, the tester processor 304 could also communicate with the FPGAs using different high speed serial protocols, e.g., Serial AT Attachment (SATA).

FPGAs 316 and 318 are connected to memory modules 308 and 304 respectively, where the memory modules perform a similar function to memory blocks 240A-240N in FIG. 2. The memory modules are coupled with and can be controlled by both the FPGA devices and the tester processor 304.

FPGAs 316 and 318 can be connected to the DUTs 372A-372M on the load board 380 through buses 352 and 354 respectively. The load board 380 is a physical harness that allows a general purpose high speed connection at the site module end that is agnostic to the protocol used to communicate to the DUTs in on lines 352 and 354. At the DUT end, however, the load board needs to be designed so as to have connectors specific to the protocol being used by the DUT.

The DUTs 372A-372M, in one embodiment of the invention, are loaded on a load board 380 that is placed inside a thermal chamber 390 for testing. The DUTs 372A-372M and the load board 380 derive power from the device power supplies 332A and 332B. The DUTs may also connect to the FPGAs through a device interface board.

The number of DUTs that can be connected to each FPGA is contingent on the number of transceivers in the FPGA and the number of I/O lanes required by each DUT. In one embodiment, FPGAs 316 and 318 can each comprise 32 high speed transceivers and buses 352 and 354 can each be 32 bits wide, however, more or less can be implemented depending on the application. If each DUT requires 8 I/O lanes, for example, only 4 DUTs can be connected to each FPGA in such a system.

In one embodiment, the communication protocol used to communicate between the tester processor 304 and the DUTs 372A-M can advantageously be reconfigurable. The communicative protocol engine in such an implementation is programmed directly into one or both of the FPGAs on the tester slice. The FPGA (e.g., 316 or 318) can therefore be configured to communicate with the DUTs in any protocol that the DUTs support. This advantageously eliminates the need for swapping out tester each time a DUT with a different protocol needs to be tested. In one embodiment, the protocols can be high speed serial protocols, including but not limited to UFS, SATA, SAS or PCIe, etc. The new or modified protocols can be downloaded and installed directly on the FPGAs via a simple bit-stream download from the system controller through the tester processor without any kind of hardware interactions. Also, if a new protocol is released, the FPGAs can easily be configured with that protocol via a software download.

In one embodiment of the present invention, each FPGA comprises a number of protocol engine modules, wherein each of the protocol engine modules within a FPGA device can be configured with a different communicative protocol. Accordingly, an FPGA device can be connected to test multiple DUTs, each supporting a different communicative protocol simultaneously. Alternatively, an FPGA device can be connected to a single DUT supporting multiple protocols and test all the modules running on the device simultaneously. For example, if an FPGA is configured to run both PCIe and UFS protocols, it can be connected to test a DUT that supports both PCIe and UFS protocols. Alternatively, it can be connected to test two different DUTs, one DUT supporting the PCIe protocol and the other DUT supporting the UFS protocol.

As mentioned earlier, a drawback of current tester systems is that most off-the-shelf FPGA systems are not configured to provide native support for UFS protocols. The UFS protocol is a high-speed communication protocol between a Host Controller and a memory device. The key benefit of the UFS protocol is that it consumes less power than other protocols, e.g., PCIe. To reduce power usage, the UFS protocol supports low speed gears and also certain power saving states. However, supporting the low speed gears and power saving states in the UFS specification requires special accommodations in the hardware, e.g., in the FPGA devices of the ATE system illustrated in FIGS. 2 and 3. Also special configurations may need to be made in the hardware because the low speed gears and power saving states may require a different type of signaling than other protocols, e.g., PCIe. UFS is not currently as widely adopted as PCIe and, therefore, off-the-shelf FPGAs do not natively support all the various modes (including the low speed gears and certain power saving states) specified in the UFS specification. Accordingly, conventional ATE systems that use FPGAs to communicate with DUTs are not able to adequately test DUTs that are UFS-compliant.

Figure 4:
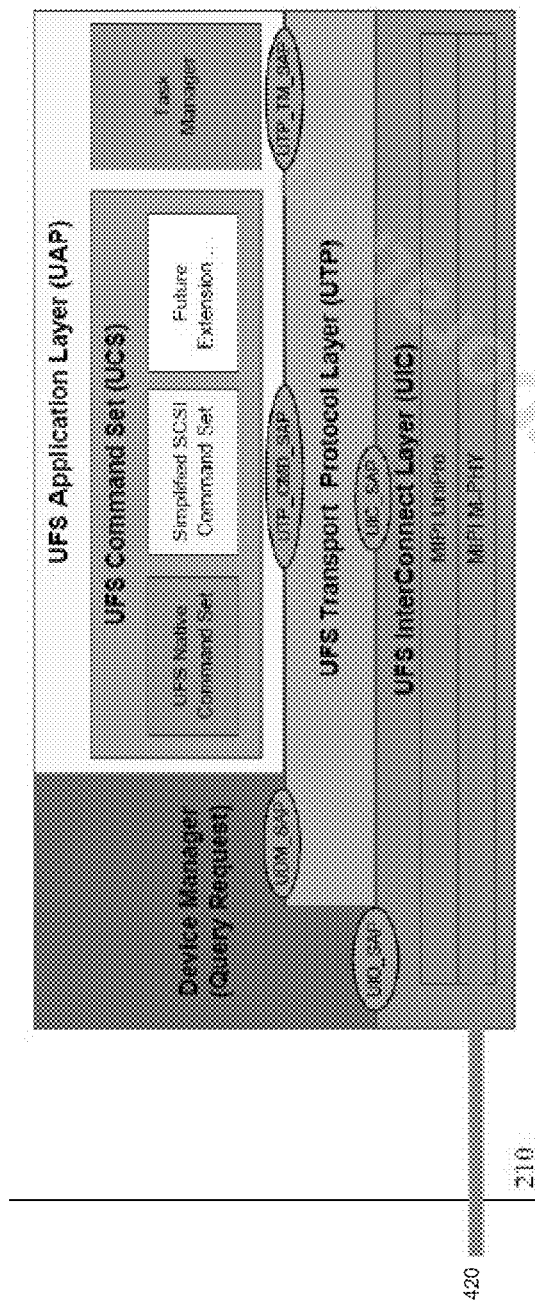
FIG. 4 illustrates the UFS architecture.

FIG. 4 illustrates the UFS architecture. UFS communication is a layered communication architecture. The electrical interface for UFS uses the M-PHY layer 420, the physical layer of the high speed serial interface comprising the board components, PCB channel, and actual voltage signals. Embodiments of the present invention, in particular, configure the FPGAs in the ATE systems to be compatible with the M-PHY layer of the UFS specification.

Figure 5:
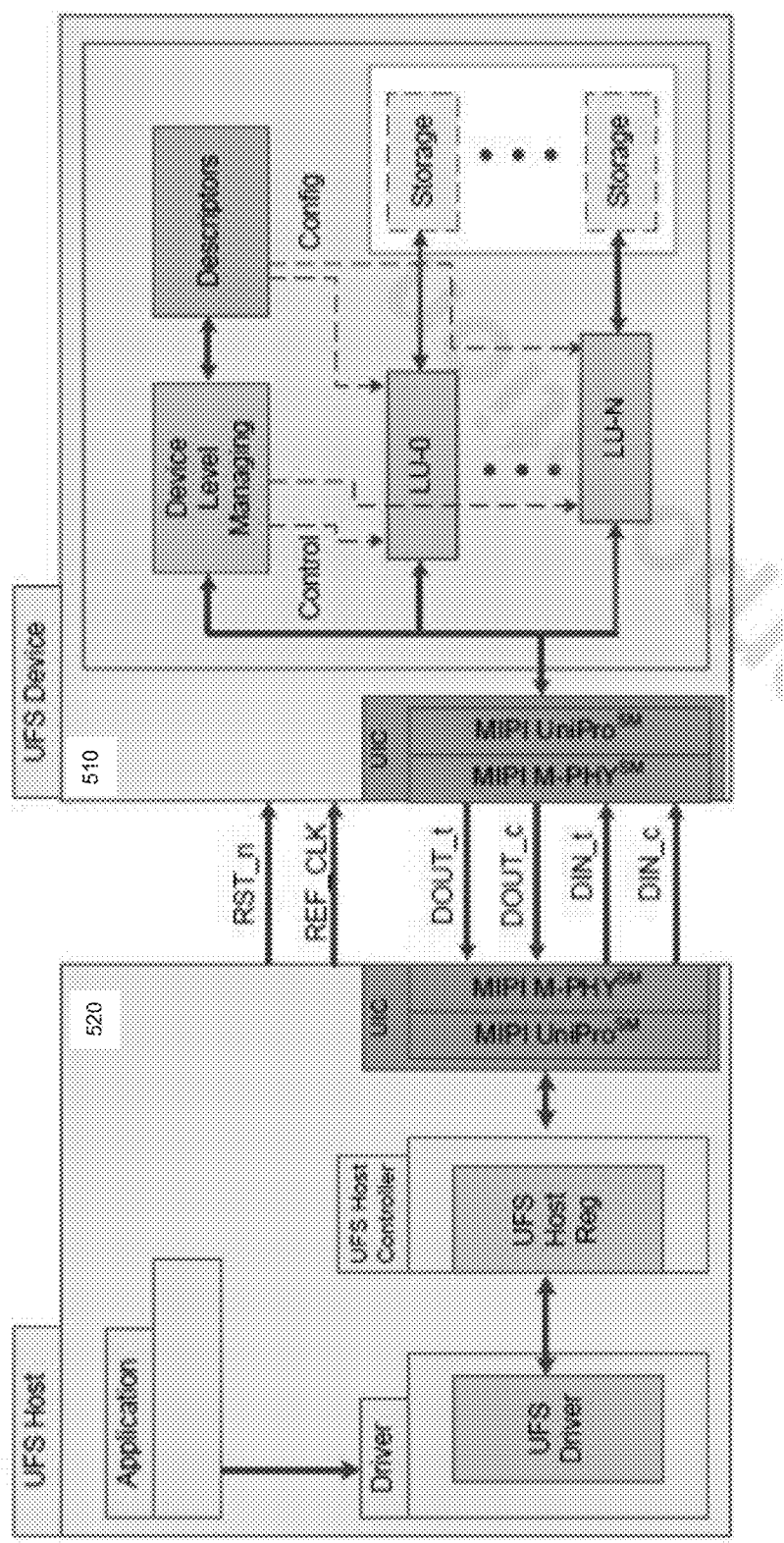
FIG. 5 illustrates a UFS device in communication with a UFS host.

FIG. 5 illustrates a UFS device in communication with a UFS host. As mentioned above, UFS is a high-speed communication protocol between a host controller 520 and a memory device 510. For example, in embodiments of the present invention, FPGAs 316 and 318, the host controllers, would communicate with and control the UFS-compliant DUTs, the memory devices. However, as mentioned above, in order to connect with and test multiple UFS-compliant DUTs concurrently, the FPGA devices in the ATE systems need to be customized to provide support for certain modes e.g., the low speed mode specified in the UFS specification and certain power saving states.

As mentioned above, in one embodiment, the interface or IP core, e.g., a UFS IP core in an FPGA, e.g., FPGA 316 or 318, may be acquired from a third party vendor but may require some customization to be compatible with the embodiments described herein.

Embodiments of the present invention provide a tester system wherein the FPGA devices are configured with the UFS IP core, which allows them to connect with and test multiple UFS-compliant DUTs concurrently. In one embodiment, the FPGA devices in the ATE systems are customized to provide support for certain modes (e.g., low speed gears and certain power saving states) specified in the UFS specification.

Embodiments of the present invention use the high-speed differential Serializer/Deserializer (SerDes) channels in off-the-shelf FPGAs to communicate with UFS-compliant DUTs. However, using the SerDes channels becomes problematic if a UFS-compliant DUT is transmitting in low speed because the FPGA SerDes receivers are always terminated. In other words, the SerDes channels in conventional off-the-shelf FPGAs do not have switchable on/off input terminations.

If a UFS-compliant DUT is transmitting pulse-width modulated (PWM) data in low speed, according to the UFS M-PHY specification, load terminations by default need to be switched off to be in Unterminated mode. The FPGA receivers have always-on differential input termination (typically 100 ohms), which cannot provide Unterminated mode. Accordingly, embodiments of the present invention make hardware modifications to the data paths from the DUTs to the FPGAs (e.g., the FPGAs illustrated in FIGS. 2 and 3) to support Unterminated communication with UFS-compliant DUTs during low speed gears.

Figure 6:
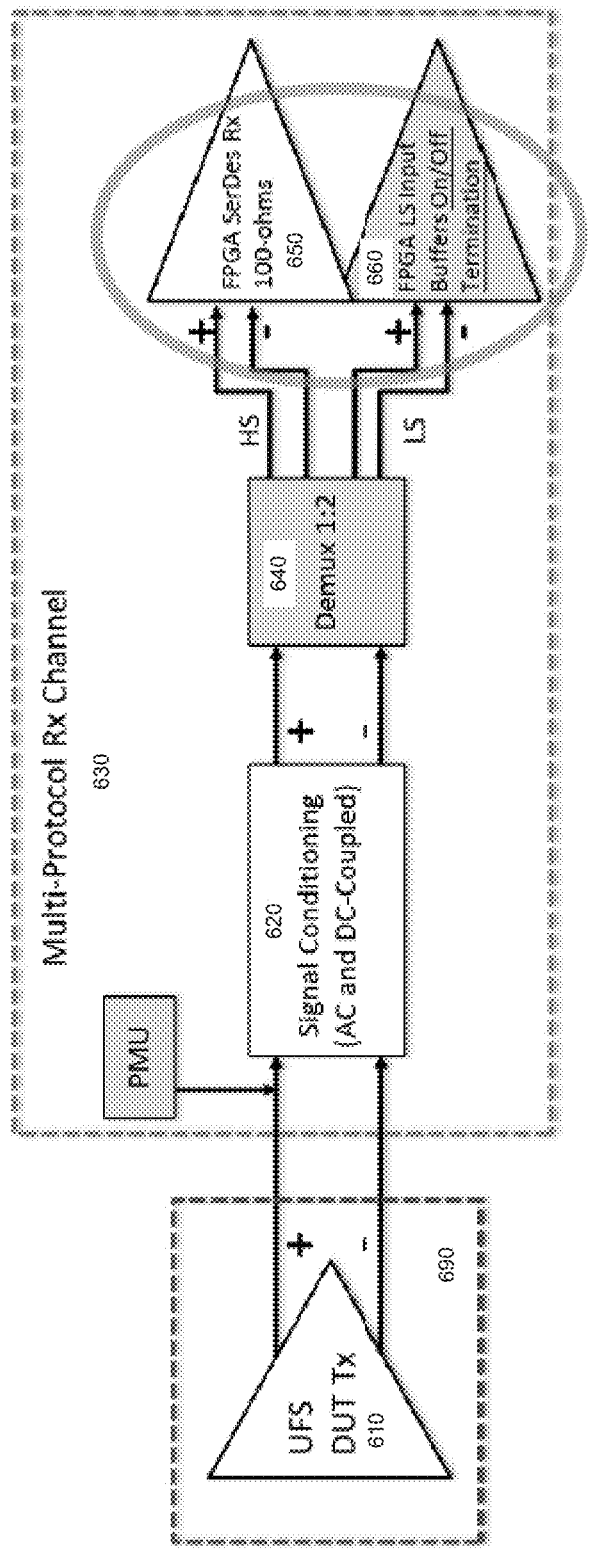
FIG. 6 illustrates the manner in which the receive channel on the FPGAs in the ATE system can be modified to be facilitate communication with UFS-compliant DUTs in accordance with an embodiment of the present invention.

FIG. 6 illustrates the manner in which the receive channels to the FPGAs in the ATE system can be modified to facilitate communication with UFS-compliant DUTs in accordance with an embodiment of the present invention.

The SerDes receive channel terminations in off-the-shelf FPGAs are always on and do not support unterminated data reception as mentioned previously. In order to address this issue, embodiments of the present invention add a 1:2 demultiplexer 640 to the multi-protocol receive channel 630 leading to the FPGA devices (e.g., FPGAs 316 and 318). The demultiplexer 640 is configured to shift data channels to alternate FPGA inputs 660 which are capable of providing on/off switchable input terminations. This provides the capability for unterminated data reception in UFS low speed gears.

By way of example, if the UFS-compliant DUT 610 (on load board 690) is transmitting to an FPGA receiver on a site module (e.g. 310A in FIG. 3) in a high-speed mode (e.g. in a high speed gear), the demultiplexer 640 will route the data to the FPGA SerDes receivers 650, which comprise an always-on differential input termination (typically 100 ohms). In a low speed PWM gear (or a low speed mode), however, in accordance with embodiments of the present invention, the demultiplexer 640 will route the PWM data to a different set of FPGA inputs 660, e.g., input buffers that comprise switchable on/off terminations. This allows for an unterminated receive mode specified in the UFS M-PHY specification. Whenever the DUT is tested or operated in a low speed PWM gear, the demultiplexer 640 will be programmed to switch the data path towards the direction of the special FPGA inputs 660. The FPGA IP core will, in one embodiment, keep track of whether the DUT is operating in a high-speed or low speed mode.

It should be noted that the alternate set of FPGA inputs 660 is not associated with the SerDes receive channels. Because the data is not high-speed, the SerDes channels are not needed to process the data. Instead alternate FPGA input buffers 660 with switchable on/off terminations receive the data. In one embodiment, the demultiplexer 640 will be a high speed demultiplexer with low loss characteristics. In one embodiment, the data traffic received from DUT 610 will be conditioned using a signal conditioning module 620, which is part of the multi-protocol receive channel 630.

By implementing the demultiplexer 640, embodiments of the present invention are able to provide support for UFS low speed mode, which is a power savings mode provided by the UFS M-PHY specification.

Another challenge associated with using off-the-shelf FPGAs for communicating with UFS-compliant DUTs is associated with providing support for certain power-saving states, e.g., HIBERN8.

Figure 7A:
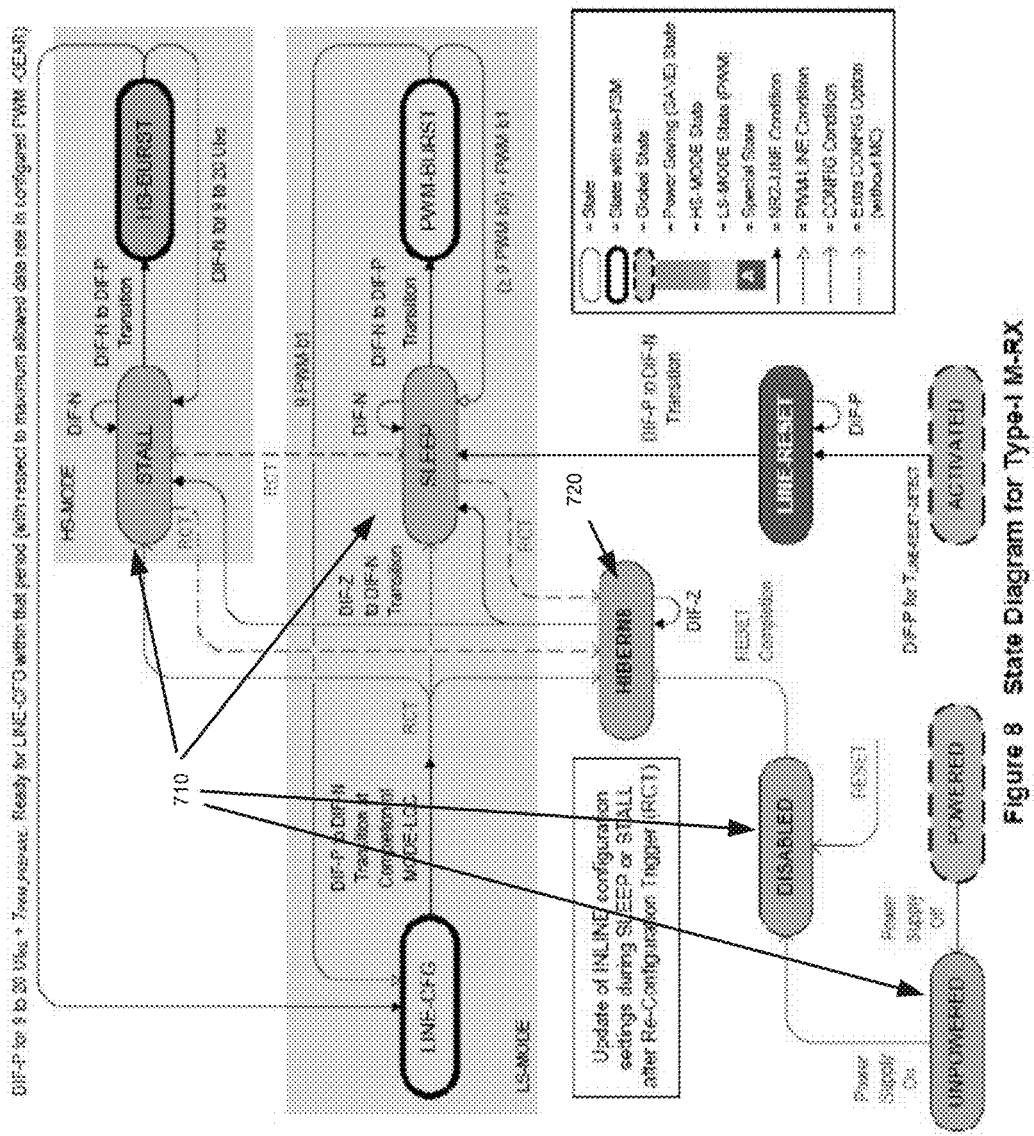
FIG. 7A illustrates typical power saving states supported by the UFS specification.

FIG. 7A illustrates typical power saving states supported by the UFS specification. For example, as shown in FIG. 7A, the UFS specification comprises several power saving states 710, e.g., UNPOWERED, DISABLED, SLEEP and STALL. Of particular interest with respect to embodiments of the present invention is the HIBERN8 power saving state 720.

According to the UFS specification, a transmitter needs to drive a step signal (DIF-N or "logic 0") to indicate the exit of a power-saving state, e.g., the HIBERN8 state. The receiver needs to detect the single step signal and correspondingly exit the HIBERN8 state in order to receive further data being transmitted by the transmitter. Conventional off-the-shelf FPGAs are not yet equipped with UFS-compliant squelch detectors to detect the step signal associated with the exiting of a power saving state.

FIG. 7B illustrates the various differential voltage line states as defined by the UFS M-PHY specification. A DIF-P is a positive differential line voltage (associated with logic '1'), a DIF-N is a negative differential line voltage (associated with logic '0') and a DIF-Z is a zero differential line voltage.

Figure 8:
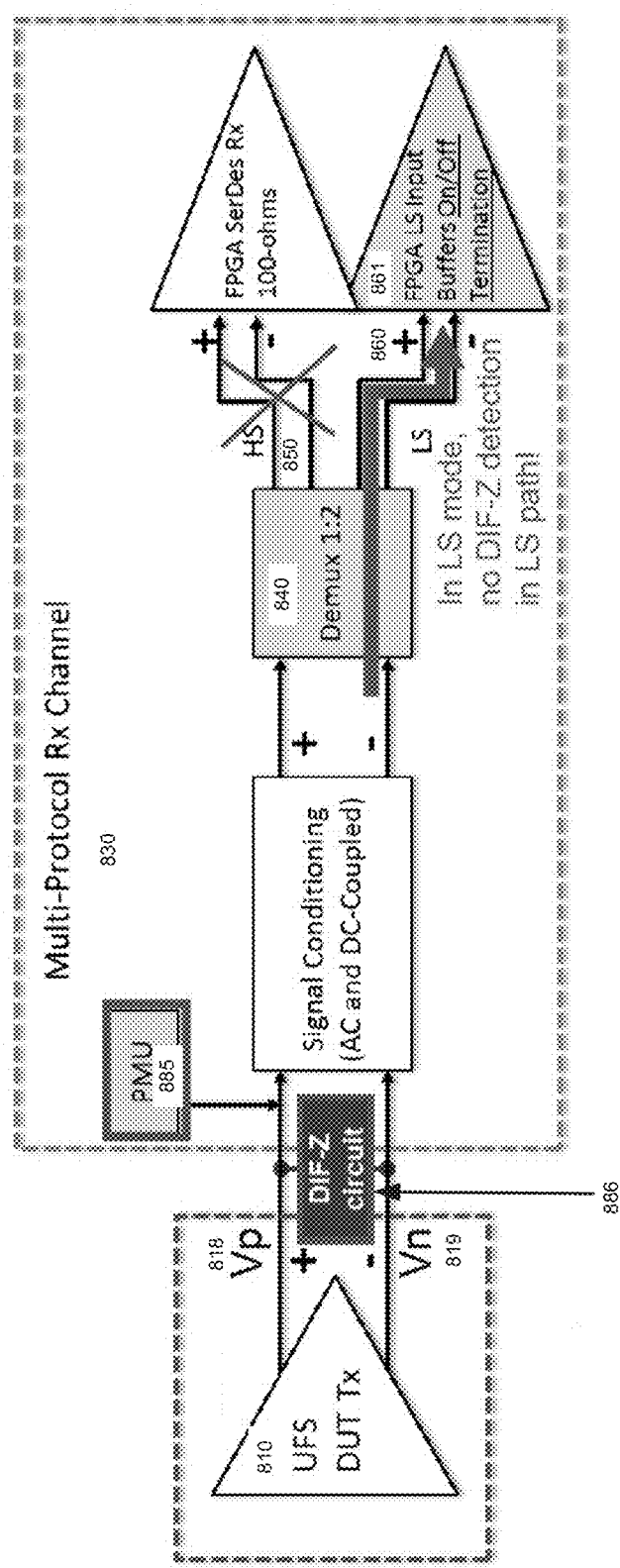
FIG. 8 illustrates the manner in which the receive channel on the FPGAs in the ATE system can be modified to detect a step signal associated with exiting a power-saving state in accordance with an embodiment of the present invention.

FIG. 8 illustrates the manner in which the receive channel on the FPGAs in the ATE system can be modified to detect a step signal associated with exiting a power-saving state in accordance with an embodiment of the present invention.

Typically, a squelch detector is required in accordance with the UFS specification to detect when a transmitter (e.g., a DUT 810) exits a power-saving state such as HIBERN8. Conventional off-the-shelf FPGAs are not equipped with UFS-compliant squelch detectors. The SerDes receive channels on an FPGA, however, comprise an Out-Of-Band (OOB) circuit that detects if an incoming signal is larger than a threshold value. If the signal is larger than the threshold value (as indicated by the OOB circuit), the receiver will acknowledge the data as being valid, otherwise, the receiver will ignore the data. During a high-speed mode, the OOB circuit in the SerDes channels can, therefore, be used to detect when a UFS-compliant DUT exits HIBERN8.

The low speed path leading to input buffers 860, however, does not comprise an OOB circuit. Accordingly, if the DUT exits HIBERN8 (by transitioning from DIF-Z to DIF-N), while in that low speed path, there would be no way to detect the DUT exiting the power-saving state.

Typically, during HIBERN8, the UFS specification requires a system to drive a DIF-Z signal on the differential line. DIF-Z occurs when Vp (line 818)=Vn (line 819). The system will usually have an external DIF-Z circuit that drives Vp and Vn equal to each other in accordance with the UFS specification. As is well known, differential signaling uses a pair of signals Vp and Vn which are 180 degrees offset from each other. DIF-Z is neither logic '1' nor logic '0'.

DIF-Z is typically an undesirable line state for digital receivers in particular because the FPGA input buffers are expecting a clear logic '1' (DIF-P) or a logic '0' (DIF-N). A DIF-Z signal usually will cause an unstable condition at the input buffers, e.g., the input buffers may remain in an undecided 'meta-stable' state.

Further, according to the UFS specification, a DUT transmitter would need to drive a DIF-Z to DIF-N step signal to indicate the exit of a HIBERN8 state. A typical UFS system would need a separate squelch detector circuit to detect the entry and exit of DIF-Z line state. The OOB circuit in the SerDes receiver path 850 can be used to detect the DIF-Z line state. However, the multi-protocol FPGA receiver channel 830 also comprises the low speed path 860, which is routed to the alternate FPGA input buffers with switchable on/off terminations through demultiplexer 840 (when the FPGA IP Core determines that the DUT is operating in the low speed gear). When the data is steered towards the alternate FPGA input buffers 861 that are non-SerDes, there is no circuitry to detect DIF-Z. Thus, the low speed path does not provide a reliable way of detecting the HIBERN8 state or an exit-of-HIBERN8 condition. Detecting DIF-Z would require additional and dedicated circuit components in the low speed path 860, which would consume significantly more space on the site-module boards.

Embodiments of the present invention advantageously avoid adding additional circuit components in the low speed path to detect DIF-Z by modifying the UFS scheme. Instead of driving a DIF-Z on the differential lines during HIBERN8, embodiments of the present invention instead use the parametric measurement unit (PMU) 885 to drive a DIF-P on the lines. In other words, while the DUT 810 is in the HIBERN8 state and is not driving the Vp 818 or Vn 819 lines, the FPGA logic is programmed to drive a DIF-P on the line using the PMU 885. For example, the PMU may connect to the positive differential line 818 and force it to drive a positive 200 mV on the line while the negative differential line 819 is grounded. The PMU 885 is a component that is already typically part of the FPGA multi-protocol receiver channel 830 and is used, among other things, to make measurements on the differential line, e.g., measurements of device input leakages etc. Accordingly, using the PMU 885 to drive a DIF-P on the line during HIBERN8 does not require adding additional components to the receiver channel and leads to a space-efficient and cost-effective solution.

In one embodiment, the FPGA controls when the DUT 810 enters the HIBERN8 state. Accordingly, once the DUT is in HIBERN8, the FPGA can communicate with the PMU 885 to assert a DIF-P on the differential line.

Driving a DIF-P on the differential line during HIBERN8 allows the low speed path input buffers 861 to receive a clear logic '1' input. The UFS logic in the FPGA IP core is modified to recognize the DIF-P asserted on the line during this time as the HIBERN8 state. In other words, the FPGA firmware is modified to recognize a DIF-P on the line while the DUT is in HIBERN8 as a bona fide HIBERN8 state. Upon the exit of the HIBERN8 state, when the UFS DUT transmitter drives a DIF-N (logic '0'), the input buffers 861 on the low speed path will clearly detect the DIF-P to DIF-N transition. In other words, upon the exit of the HIBERN8 state, the DUT will drive a DIF-N (logic '0') onto the receiver channel, thereby overdriving the DIF-P state. The logic in the FPGA looks for this DIF-P to DIF-N transition to reliably determine the exit of the HIBERN8 state.

Driving a DIF-P on the line during HIBERN8 (instead of a DIF-Z) advantageously avoids the input buffers 861 from becoming trapped in an undecided meta-stable state. Embodiments of the present invention are thereby able to configure the FPGAs to detect the UFS HIBERN8-exit condition (in both high speed and low speed states) without adding board-level circuitry to implement a UFS M-PHY squelch-detector.

Without driving a DIF-P on the line, it would not be possible to reliably detect a HIBERN8-exit condition in a low speed gear. This is because, by definition of the HIBERN8 state, the receive channel would be at differential-zero (DIF-Z) where both positive and negative differential lines are of (nearly) equal voltage and in high impedance mode. As such, any minute differences between the positive and negative differential lines would cause the low speed high-gain input buffers to amplify the difference to be an erroneous interpretation of a DIF-P or DIF-N state. This may cause an erroneous HIBERN8-exit detection or even a line reset.

It should be noted that if the PMU 885 were not actively driving a DIF-P on the line during HIBERN8, the DIF-Z circuit 886 by default would drive a DIF-Z on the line.

Figure 9:
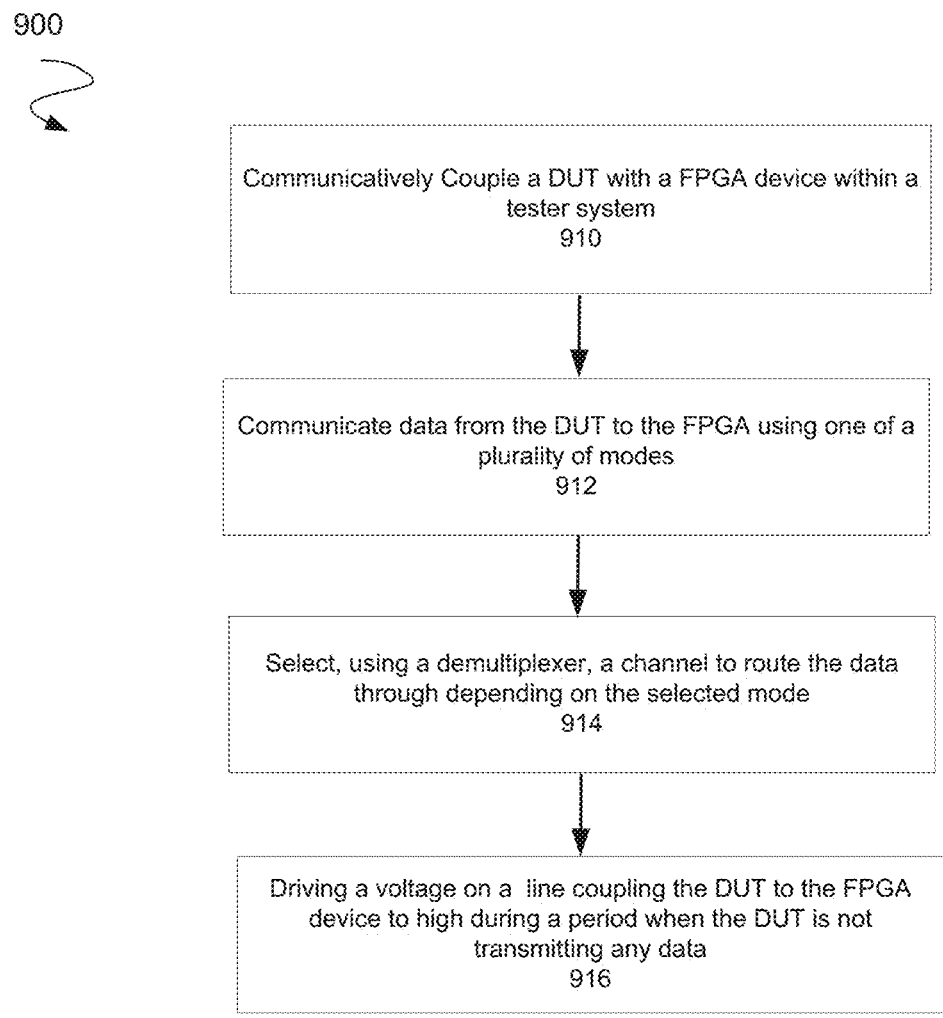
FIG. 9 depicts a flowchart 900 of an exemplary process of communicating data between a DUT and an FPGA receiver in a tester system using the UFS protocol according to an embodiment of the present invention.

FIG. 9 depicts a flowchart 900 of an exemplary process of communicating data between a DUT and an FPGA receiver in a tester system using the UFS protocol according to an embodiment of the present invention. The invention, however, is not limited to the description provided by flowchart 900. Rather, it will be apparent to persons skilled in the relevant art(s) from the teachings provided herein that other functional flows are within the scope and spirit of the present invention.

At block 910, a UFS-compliant DUT is communicatively coupled with an FPGA (e.g., FPGA 316 and 318) in a tester system for testing purposes.

At block 912, the DUT transmitter communicates data to the FPGA over a channel (e.g. a differential channel) in one of a plurality of modes, e.g., low speed mode, high speed mode etc.

At block 914, a demultiplexer is used to select a channel to route the data from the DUT through depending on the mode. For example, low speed data is routed through channel 860 while high speed data may be routed through channel 850.

At block 916, a voltage on the line coupling the DUT and the FPGA is driven high during a period when the DUT is not transmitting any data, e.g., during a power saving state such as HIBERN8 specified in the UFS specification.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

What is claimed is:

1. An automated test equipment (ATE) system comprising:
   a computer system comprising a system controller, wherein the system controller is communicatively coupled to a tester processor and an FPGA;
   the FPGA is communicatively coupled to the tester processor, wherein the FPGA is configured to internally generate commands and data transparently from the tester processor for testing a DUT; and
   a demultiplexer positioned between the DUT and the FPGA, wherein, responsive to a determination that the DUT is operating in a high speed mode, the demultiplexer is configured to channel data traffic from the DUT to a Serializer/Deserializer (SerDes) receiver on the FPGA, and further wherein, responsive to a determination that the DUT is operating in a low speed mode, the demultiplexer is configured to channel data traffic from the DUT to input buffers on the FPGA with switchable on/off input terminations.

2. The ATE system of claim 1, wherein the tester processor is configured to operate in one of a plurality of functional modes, wherein each functional mode is configured to allocate functionality for generating commands and for generating data between the tester processor and the FPGA in a different manner.

3. The ATE system of claim 1, wherein the DUT communicates with the FPGA using a Universal Flash Storage (UFS) protocol.

4. The ATE system of claim 1, wherein in the high speed mode, the demultiplexer channels data traffic from the DUT to the SerDes receiver using a SerDes channel, wherein the SerDes receiver on the FPGA comprises an always-on input termination.

5. The ATE system of claim 1, the data traffic in the low speed mode is pulse width modulated (PWM) data.

6. The ATE system of claim 1, wherein the demultiplexer comprises a high speed demultiplexer with low loss characteristics.

7. The ATE system of claim 1, further comprising:
a parametric measurement unit (PMU) coupled to an output of the DUT, wherein, responsive to a determination that the DUT is in a power saving state, the PMU is configured to drive the output of the DUT to a logic "1" state.

8. The ATE system of claim 7, wherein the DUT communicates with the FPGA using a UFS protocol, and wherein the power saving state is a HIBERN8 state.

9. The ATE system of claim 7, wherein the DUT indicates to the FPGA an exit of the power saving state by overdriving the logic "1" state to a logic "0" state.

10. The ATE system of claim 7, wherein the FPGA comprises a plurality of IP cores, wherein at least one of the plurality of IP cores is operable to be programmed to emulate a UFS protocol.

11. The ATE system of claim 10, wherein each of the plurality of IP cores is operable to be re-programmed to emulate a different protocol.

12. A tester system comprising:
a system controller, wherein the system controller is communicatively coupled to a plurality of tester slice, wherein each tester slice comprises a tester processor and an FPGA;
the FPGA is communicatively coupled to the tester processor, wherein the FPGA is configured to internally generate commands and data transparently from the tester processor for testing a plurality of DUTs, wherein the plurality of DUTs are communicatively coupled to the FPGA, and wherein the plurality of DUTs are configured to communicate using at least the UFS protocol; and
a demultiplexer positioned between each of the plurality of DUTs and the FPGA, wherein, responsive to a determination that a respective DUT is operating in a high speed mode, the demultiplexer is configured to channel data traffic from the DUT to a Serializer/Deserializer (SerDes) receiver on the FPGA, and further wherein, responsive to a determination that the respective DUT is operating in a low speed mode, the demultiplexer is configured to channel data traffic from the DUT to input buffers on the FPGA with switchable input terminations.

13. The tester system of claim 12, wherein in the high speed mode, the demultiplexer channels data traffic from the respective DUT to the SerDes receiver using a SerDes channel, wherein the SerDes receiver on the FPGA comprises an always-on input termination.

14. The tester system of claim 12, wherein the demultiplexer comprises a high speed demultiplexer with low loss characteristics.

15. The tester system of claim 12, further comprising:
a parametric measurement unit (PMU) coupled to an output of the respective DUT, wherein, responsive to a determination that the respective DUT is in a power saving state, the PMU is configured to drive the output of the respective DUT to a logic "1" state.

16. The tester system of claim 15, wherein the output of the respective DUT is a differential output.

17. The tester system of claim 15, wherein the power saving state is a HIBERN8 state.

18. The tester system of claim 15, wherein the respective DUT indicates to the FPGA an exit of the power saving state by overdriving the logic "1" state to a logic "0" state.

19. A method for testing using an automated test equipment (ATE) comprising:
transmitting data from a DUT to an FPGA device in a tester system, wherein the DUT is configured to communicate with the FPGA device using the UFS protocol, and wherein the DUT is configured to communicate with the FPGA using a plurality of modes supported by the UFS protocol, wherein the plurality of modes comprise at least a high speed mode and a low speed mode; and
selecting, using a demultiplexer, a receive channel to route the data to the FPGA, wherein the selected receive channel depends on a mode of operation of the DUT, wherein
responsive to a determination that the DUT is operating in the high speed mode, the demultiplexer selects a SerDes channel to route the data to the FPGA, and responsive to a determination that the DUT is operating in the low speed mode, the demultiplexer selects a channel comprising switchable input terminations to route the data to the FPGA.

20. The method of claim 19, further comprising:
driving a voltage on a line coupling the DUT to the FPGA device to a logic "1" during a period when the DUT is operating in a power saving mode.

* * * * *